United States Patent
Xu et al.

(10) Patent No.: US 11,716,032 B2
(45) Date of Patent: *Aug. 1, 2023

(54) MULTI-LEVEL INVERTER CLAMPING MODULATION METHOD AND APPARATUS, AND INVERTER

(71) Applicant: Huawei Digital Power Technologies Co., Ltd., Shenzhen (CN)

(72) Inventors: Fei Xu, Shenzhen (CN); Fei Ye, Shenzhen (CN); Lei Shi, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/729,340

(22) Filed: Apr. 26, 2022

(65) Prior Publication Data

US 2022/0255458 A1 Aug. 11, 2022

Related U.S. Application Data

(63) Continuation of application No. 17/088,088, filed on Nov. 3, 2020, now Pat. No. 11,356,034, which is a (Continued)

(30) Foreign Application Priority Data

Jul. 5, 2018 (CN) .......................... 201810731979.8

(51) Int. Cl.
*H02M 7/487* (2007.01)
*G01R 19/175* (2006.01)
(Continued)

(52) U.S. Cl.
CPC .......... *H02M 7/487* (2013.01); *G01R 19/175* (2013.01); *H02M 1/38* (2013.01); *H02M 7/5387* (2013.01); *H02M 1/0058* (2021.05); *H02M 1/385* (2021.05)

(58) Field of Classification Search
CPC ...... H02M 7/487; H02M 1/38; H02M 7/5387; H02M 1/385; H02M 1/0058; G01R 19/175
See application file for complete search history.

(56) References Cited

U.S. PATENT DOCUMENTS 8,842,452 B2    9/2014  Nielsen
10,084,391 B2 * 9/2018  Xu ............................ H02J 7/35
(Continued)

FOREIGN PATENT DOCUMENTS

CN    101860249 A    10/2010
CN    204231221 U     3/2015
(Continued)

*Primary Examiner* — Adolf D Berhane
(74) *Attorney, Agent, or Firm* — Gregg L. Jansen

(57) ABSTRACT

Embodiments of the present application disclose a multi-level inverter clamping modulation method and apparatus, and an inverter. Switching elements of an inverter are controlled when an output voltage of the inverter crosses zero, and switching elements in each inverter bridge arm of an active clamp multi-level inverter include an internal tube, an external tube, and a clamping tube. The internal tube and the external tube are connected in series between a positive bus and a negative bus, the clamping tube is connected between a common terminal of the internal tube and the external tube and a bus, the internal tube is a low-frequency switching element, and the external tube and the clamping tube are high-frequency switching elements.

18 Claims, 6 Drawing Sheets

Related U.S. Application Data continuation of application No. PCT/CN2018/119583, filed on Dec. 6, 2018.

(51) Int. Cl.
*H02M 1/38* (2007.01)
*H02M 7/5387* (2007.01)
*H02M 1/00* (2006.01)

(56) References Cited

U.S. PATENT DOCUMENTS

| | | | |
|---|---|---|---|
| 11,356,034 B2 * | 6/2022 | Xu | H02M 7/487 |
| 2012/0218785 A1 | 8/2012 | Li et al. | |
| 2013/0088901 A1 | 4/2013 | Bleus et al. | |
| 2014/0009984 A1 | 1/2014 | Takizawa | |
| 2015/0131352 A1 | 5/2015 | Hart et al. | |
| 2015/0256104 A1 | 9/2015 | Fu | |
| 2016/0336872 A1 | 11/2016 | Cheng et al. | |
| 2016/0352251 A1 | 12/2016 | Li et al. | |
| 2017/0373586 A1 | 12/2017 | Zhang et al. | |
| 2018/0316276 A1 | 11/2018 | Zhuang et al. | |
| 2019/0013743 A1 | 1/2019 | Zhang et al. | |
| 2019/0140557 A1 | 5/2019 | Zhang et al. | |
| 2019/0363644 A1 | 11/2019 | Li et al. | |
| 2020/0350833 A1 | 11/2020 | Corzine et al. | |

FOREIGN PATENT DOCUMENTS

| | | |
|---|---|---|
| CN | 105186902 A | 12/2015 |
| CN | 104052254 B | 8/2016 |
| CN | 106655853 A | 5/2017 |
| CN | 106877720 A | 6/2017 |
| CN | 107681913 A | 2/2018 |
| CN | 108880311 A | 11/2018 |
| JP | 3322069 B2 | 9/2002 |

* cited by examiner

MULTI-LEVEL INVERTER CLAMPING MODULATION METHOD AND APPARATUS, AND INVERTER

CROSS-REFERENCE TO RELATED APPLICATIONS

This application is a continuation of U.S. patent application Ser. No. 17/088,088, filed on Nov. 3, 2020, which is a continuation of International Application No. PCT/CN2018/119583, filed on Dec. 6, 2018, which claims priority to Chinese Patent Application No. 201810731979.8, filed on Jul. 5, 2018. All of the afore-mentioned patent applications are hereby incorporated by reference in their entireties.

TECHNICAL FIELD

The present invention relates to the field of power electronics technologies, and in particular, to a multi-level inverter clamping modulation method and apparatus, and an inverter.

BACKGROUND

An active neutral point clamp (ANPC) three-level inverter can use sinusoidal pulse width modulation (SPWM) to generate a drive signal for a switching element, and the drive signal controls the switching element to be on or off, thereby generating, at an output terminal, a voltage Vout having three levels: "positive", "negative", and "zero". Therefore, the ANPC three-level inverter is referred to as a three-level inverter.

The following describes an operating principle of the ANPC three-level inverter during normal operation.

Some switching elements in the ANPC inverter are turned on/off at a very high frequency, and therefore these switching elements are referred to as high-frequency switching elements.

The rest of switching elements in the ANPC inverter are turned on/off based on a status of a modulated sinusoidal wave. To be specific, these switching elements operate at an industrial frequency, and therefore are referred to as industrial-frequency switching elements.

Correspondingly, a first dead time (tdt1) is usually configured between high-frequency switching elements, and a second dead time (tdt2) is configured between low-frequency switching elements, where tdt1<tdt2.

However, when an output voltage Vout of an ANPC inverter is at a zero crossing point, a low-frequency switching element is in a dead time of status switching. In this case, if a high-frequency switching element is turned on first (tdt1<tdt2), a whole bus voltage is possibly applied to one low-frequency switching element, damaging the low-frequency switching element because the bus voltage has exceeded a withstand voltage of the low-frequency switching element.

SUMMARY

To resolve the foregoing technical problem in the prior art, the present invention provides a multi-level inverter clamping modulation method, to effectively clamp a voltage of each switching element within a safe range, so as to resolve a problem that a low-frequency switching element is damaged due to an excessively high voltage stress during zero crossing switching of an output voltage.

According to a first aspect, a multi-level inverter control method is provided, where switching elements of an active clamp multi-level inverter are controlled when an output voltage of the inverter crosses zero, and switching elements in each inverter bridge arm of the active clamp multi-level inverter include an internal tube, an external tube, and a clamping tube, where the internal tube and the external tube are connected in series between a positive bus and a negative bus, the clamping tube is connected between a common terminal of the internal tube and the external tube and a bus, the internal tube is a low-frequency switching element, and the external tube and the clamping tube are high-frequency switching elements; and the method includes:

detecting whether an output voltage of a bridge arm of the active clamp multi-level inverter has crossed zero; and if the output voltage of the bridge arm of the active clamp multi-level inverter has crossed zero, controlling a corresponding clamping tube to be always on in a predetermined time period after the output voltage crosses zero, or controlling two clamping tubes to be both always on in a predetermined time period after the output voltage crosses zero.

When the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This can resolve a problem that one low-frequency switching element withstands the whole bus voltage if a high-frequency switching element is turned on at this time.

In an embodiment, when the output voltage crosses zero from a positive half cycle, the controlling a corresponding clamping tube to be always on in a predetermined time period after the output voltage crosses zero is specifically:

controlling a clamping tube in a lower half bridge to be always on in the predetermined time period after the output voltage crosses zero.

In an embodiment, when the output voltage crosses zero from a negative half cycle, the controlling a corresponding clamping tube to be always on in a predetermined time period after the output voltage crosses zero is specifically:

controlling a clamping tube in an upper half bridge to be always on in the predetermined time period after the output voltage crosses zero.

In an embodiment, the predetermined time period after the output voltage crosses zero is:

the first high-frequency switching cycle after the output voltage crosses zero.

In an embodiment, a first dead time corresponding to the high-frequency switching elements is shorter than a second dead time corresponding to the low-frequency switching elements.

In an embodiment, the method further includes: after the second dead time corresponding to the low-frequency switching elements expires, controlling an internal tube in the lower half bridge to be on.

In an embodiment, the method further includes: after the second dead time corresponding to the low-frequency switching elements expires, controlling an internal tube in the upper half bridge to be on.

The predetermined time period may be set as needed. For example, the predetermined time period after the output voltage crosses zero is the first high-frequency switching cycle after the output voltage crosses zero. Alternatively, the corresponding clamping tube may be controlled to be on during all the first N high-frequency switching cycles after the output voltage crosses zero, where N is a positive integer. For example, if N=2, the clamping tube is controlled to be always on in the first two high-frequency switching cycles after the output voltage crosses zero. However, a value of N cannot be excessively large, because a shorter predetermined time period is preferable. If the predetermined time period is excessively long, output efficiency of the inverter is reduced. Therefore, the preset time period may be shortened as much as possible while a voltage stress problem of a switching element is resolved.

The method can well eliminate an overvoltage risk to an industrial-frequency switching tube, and brings a beneficial effect that a plurality of clamping freewheeling circuits can be provided to greatly reduce commutation circuits during voltage switching of a bridge arm. Using a positive current as an example for description, when T2 and T3 are both on, there are the following two current paths: Bus_N-D2-T5-I_out and Bus_N-T3-D6-I_out. Because there are the foregoing two current paths, leakage inductance of the two current paths is in parallel with each other, reducing leakage inductance in a commutation circuit. Smaller leakage inductance in the commutation circuit leads to a lower overvoltage risk to a switching element in a commutation process.

According to a second aspect, a multi-level inverter control apparatus is provided, where switching elements of an active clamp multi-level inverter are controlled when an output voltage of the inverter crosses zero, and switching elements in each inverter bridge arm of the active clamp multi-level inverter include an internal tube, an external tube, and a clamping tube, where the internal tube and the external tube are connected in series between a positive bus and a negative bus, the clamping tube is connected between a common terminal of the internal tube and the external tube and a bus, the internal tube is a low-frequency switching element, and the external tube and the clamping tube are high-frequency switching elements; and the apparatus includes a detection circuit and a control module, where the detection circuit is configured to detect whether an output voltage of a bridge arm of the active clamp multi-level inverter has crossed zero; and the control module is configured to: when the detection circuit detects that the output voltage has crossed zero, control a corresponding clamping tube to be always on in a predetermined time period after the output voltage crosses zero, or control two clamping tubes to be both always on in a predetermined time period after the output voltage crosses zero.

When the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This avoids a problem that one low-frequency switching element withstands the whole bus voltage if a high-frequency switching element is turned on at this time.

In an embodiment, when the output voltage crosses zero from a positive half cycle, that the control module controls a corresponding clamping tube to be always on in a predetermined time period after the output voltage crosses zero is specifically:

controlling a clamping tube in a lower half bridge to be always on in the predetermined time period after the output voltage crosses zero.

In an embodiment, when the output voltage crosses zero from a negative half cycle, that the control module controls a corresponding clamping tube to be always on in a predetermined time period after the output voltage crosses zero is specifically:

controlling a clamping tube in an upper half bridge to be always on in the predetermined time period after the output voltage crosses zero.

In an embodiment, the predetermined time period after the output voltage crosses zero is:

the first high-frequency switching cycle after the output voltage crosses zero.

The predetermined time period may be set as needed. For example, the predetermined time period after the output voltage crosses zero is the first high-frequency switching cycle after the output voltage crosses zero. Alternatively, the corresponding clamping tube may be controlled to be on during all the first N high-frequency switching cycles after the output voltage crosses zero, where N is a positive integer. For example, if N=2, the clamping tube is controlled to be always on in the first two high-frequency switching cycles after the output voltage crosses zero. However, a value of N cannot be excessively large, because a shorter predetermined time period is preferable. If the predetermined time period is excessively long, output efficiency of the inverter is reduced. Therefore, the preset time period may be shortened as much as possible while a voltage stress problem of a switching element is resolved.

According to a third aspect, a multi-level inverter is provided. The multi-level inverter is an active clamp multi-level inverter, and switching elements in each inverter bridge arm of the active clamp multi-level inverter include an internal tube, an external tube, and a clamping tube, where the internal tube and the external tube are connected in series between a positive bus and a negative bus, the clamping tube is connected between a common terminal of the internal tube and the external tube and a bus, the internal tube is a low-frequency switching element, and the external tube and the clamping tube are high-frequency switching elements; and the multi-level inverter includes a voltage detection circuit and a controller, where the voltage detection circuit is configured to detect whether an output voltage of a bridge arm of the active clamp multi-level inverter has crossed zero; and the controller is configured to: when the voltage detection circuit detects that the output voltage has crossed zero, control a corresponding clamping tube to be always on in a predetermined time period after the output voltage crosses zero, or control two clamping tubes to be both always on in a predetermined time period after the output voltage crosses zero.

When the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This can resolve a problem that one low-frequency switching element withstands the whole bus voltage if a high-frequency switching element is turned on at this time.

In an embodiment, when the output voltage crosses zero from a positive half cycle, that the controller controls a corresponding clamping tube to be always on in a predetermined time period after the output voltage crosses zero is specifically:

controlling a clamping tube in a lower half bridge to be always on in the predetermined time period after the output voltage crosses zero.

In an embodiment, when the output voltage crosses zero from a negative half cycle, that the controller controls a corresponding clamping tube to be always on in a predetermined time period after the output voltage crosses zero is specifically:

controlling a clamping tube in an upper half bridge to be always on in the predetermined time period after the output voltage crosses zero.

Compared with the prior art, embodiments of the present application have at least the following advantages:

The switching elements of the active clamp multi-level inverter are controlled when the output voltage of the inverter crosses zero, and the method includes: detecting whether an output voltage of a bridge arm of the active clamp multi-level inverter has crossed zero; and if the output voltage of the bridge arm of the active clamp multi-level inverter has crossed zero, controlling a corresponding clamping tube to be always on in a predetermined time period after the output voltage crosses zero, or controlling two clamping tubes to be both always on in a predetermined time period after the output voltage crosses zero. When the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This can resolve a problem that one low-frequency switching element withstands the whole bus voltage if a high-frequency switching element is turned on at this time.

BRIEF DESCRIPTION OF DRAWINGS

To describe the technical solutions in the embodiments of this application or in the prior art more clearly, the following briefly describes the accompanying drawings required for describing the embodiments or the prior art. Apparently, the accompanying drawings in the following description show some embodiments of this application, and persons of ordinary skill in the art may still derive other drawings from these accompanying drawings without creative efforts.

DESCRIPTION OF EMBODIMENTS

To make persons skilled in the art understand the solutions in the present invention better, the following clearly and completely describes the technical solutions in the embodiments of the present invention with reference to the accompanying drawings in the embodiments of the present application. Apparently, the described embodiments are merely a part rather than all of the embodiments of the present application. All other embodiments obtained by persons of ordinary skill in the art based on the embodiments of the present application without creative efforts shall fall within the protection scope of embodiments of the present application.

Figure 1:
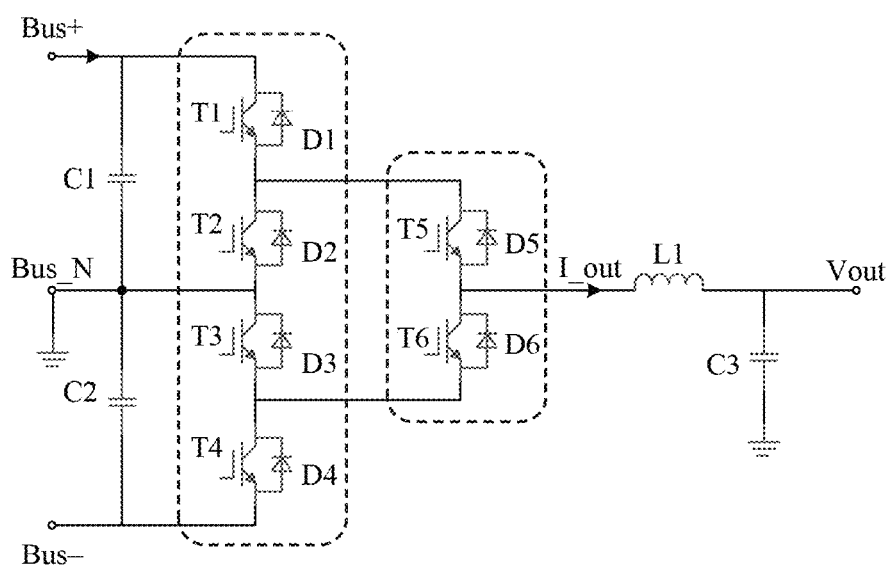
FIG. 1 is a schematic diagram of an ANPC three-level inverter according to an embodiment of this application.

To make persons skilled in the art better understand the technical solutions provided in the embodiments of this application, the following describes an operating principle of an ANPC inverter in detail with reference to FIG. 1.

The following describes the operating principle of the ANPC three-level inverter during normal operation.

Switching elements T1 to T4 are turned on/off at a very high frequency, and therefore T1 to T4 are referred to as high-frequency switching elements. States of T1 and T2 are complementary to each other (that is, when T1 is on, T2 is off; or when T1 is off, T2 is on), and states of T3 and T4 are complementary to each other. T2 and T3 are used for clamping, and therefore T2 and T3 are referred to as clamping tubes. T1, T5, T6, and T4 form a bridge arm. T1 and T4 are on an outer side, and T5 and T6 are on an inner side, and therefore T1 and T4 are referred to as external tubes, and T5 and T6 are referred to as internal tubes. As shown in FIG. 1, the internal tubes and the external tubes are connected in series between a positive Bus+ and a negative Bus−, and the clamping tube is connected between a common terminal of the internal tubes and the external tubes and a bus.

The switching elements T5 and T6 are turned on/off based on a status of a modulated sinusoidal wave. To be specific, T5 and T6 operate at an industrial frequency, and therefore T5 and T6 are referred to as industrial-frequency switching elements. Compared with a high-frequency switching element, an industrial-frequency switching element is also referred to as a low-frequency switching element. For example, an industrial frequency may be 50 Hz, but a high frequency is usually a dozen of kHz or two dozens of kHz. States of T5 and T6 are complementary to each other.

Correspondingly, a first dead time (tdt1) is usually configured between high-frequency switching elements, and a second dead time (tdt2) is configured between low-frequency switching elements, where tdt1<tdt2.

Through research, when an output voltage Vout of an ANPC inverter is at a zero crossing point, a low-frequency switching element is in a dead time of status switching. In this case, if a high-frequency switching element is turned on first (tdt1<tdt2), a whole bus voltage is possibly applied to one low-frequency switching element, damaging the low-frequency switching element because the bus voltage has exceeded a withstand voltage of the low-frequency switching element.

Figure 2:
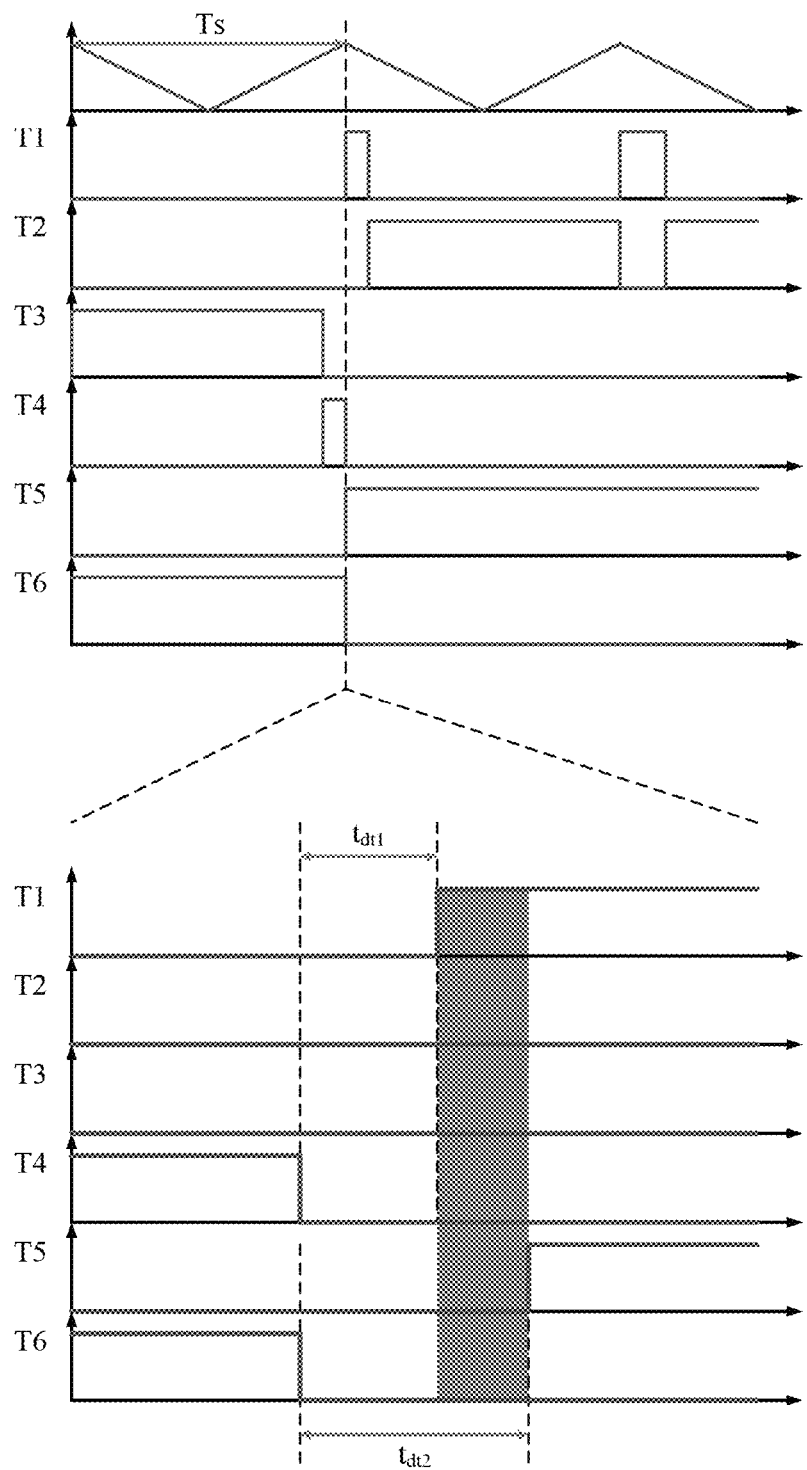
FIG. 2 is a drive signal waveform diagram when an output voltage corresponding to FIG. 1 crosses zero.

With reference to a waveform diagram, the following describes on/off states at a zero crossing point by using an example. FIG. 2 is a drive signal waveform diagram when an output voltage crosses zero.

When an output voltage of an ANPC inverter is at a zero crossing point, a process of switching from negative voltage output to positive voltage output is to be performed. An output current remains positive (Iout>0), to be specific, an output terminal of the ANPC inverter is connected to a capacitive load. In a second dead time (tdt2) of an industrial-frequency switching element, T6 is off, but T5 is not on, and the output current freewheels through diodes D4 and D6. If T1 is on in this case, a whole bus voltage is applied to two ends of T5. Because a withstand voltage of T5 is designed according to a half of the bus voltage, T5 is damaged due to withstanding an overvoltage.

To resolve a problem that a switching element withstands a high voltage when an output voltage crosses zero, one solution is configuring T5 and T6 shown in FIG. 1 as high-frequency switching elements and configuring the clamping tubes (T2 and T3) as low-frequency switching elements.

A specific modulation method of the ANPC inverter is: when an output voltage is instructed to undergo zero crossing switching, keeping an overlap between on periods of two clamping tubes, thereby ensuring that an output voltage can be clamped to a neutral-point voltage of a direct current bus. A specific measure is a modulation mode in which the internal tubes (T5 and T6) are turned on/off at a high frequency and the clamping tubes (T2 and T3) are turned on/off at a low frequency.

However, it is determined that a time sequence for controlling, near a zero crossing point of an output voltage, an overlap between on periods of clamping tubes is relatively complex.

Therefore, based on the foregoing complex control solution, the embodiments of this application provide a multi-level inverter control method. Switching elements of an active clamp multi-level inverter are controlled when an output voltage of the inverter crosses zero. The method includes: detecting whether an output voltage of a bridge arm of the active clamp multi-level inverter has crossed zero; and if the output voltage of the bridge arm of the active clamp multi-level inverter has crossed zero, controlling a corresponding clamping tube to be always on in a predetermined time period after the output voltage crosses zero, or controlling two clamping tubes to be both always on in a predetermined time period after the output voltage crosses zero. When the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This can resolve a problem that one low-frequency switching element withstands the whole bus voltage if a high-frequency switching element is turned on at this time.

It should be noted that a topology of the ANPC inverter is fixed, as shown in FIG. 1. However, for the inverter shown in FIG. 1, there may be a plurality of control manners. The control method provided in the embodiments of this application can resolve a technical problem that a whole bus voltage is applied to one low-frequency switching element when an output voltage crosses zero. The following provides detailed description with reference to the accompanying drawings.

Method Embodiment 1

Figure 3:
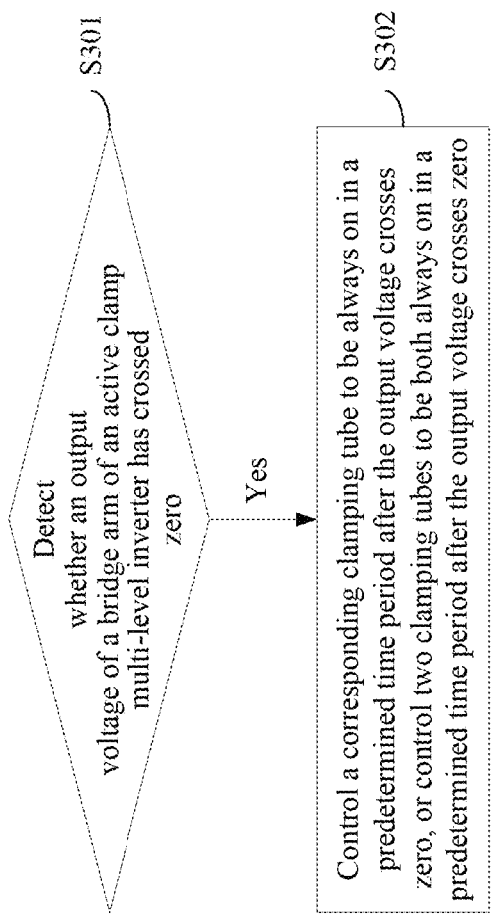
FIG. 3 is a flowchart of a multi-level inverter control method according to an embodiment of this application.

FIG. 3 is a flowchart of a multi-level inverter control method according to an embodiment of this application.

In the multi-level inverter control method provided in this embodiment, switching elements of an active clamp multi-level inverter are controlled when an output voltage of the inverter crosses zero, and switching elements in each inverter bridge arm of the active clamp multi-level inverter include an internal tube, an external tube, and a clamping tube. The internal tube and the external tube are connected in series between a positive bus and a negative bus, the clamping tube is connected between a common terminal of the internal tube and the external tube and a bus, the internal tube is a low-frequency switching element, and the external tube and the clamping tube are high-frequency switching elements.

Still referring to FIG. 1, clamping tubes include T2 and T3, external tubes include T1 and T4, and internal tubes include T5 and T6. T5 and T6 are low-frequency switching elements, and T2, T3, T1, and T4 are high-frequency elements.

The method includes the following operations.

S301: Detect whether an output voltage of a bridge arm of the active clamp multi-level inverter has crossed zero.

Because the inverter includes two bridge arms or three bridge arms, this detection needs to be performed specific to each individual bridge arm. A switching element corresponding to a bridge arm is controlled based on an output voltage of the bridge arm.

Still referring to a topological graph in FIG. 1, an upper half bridge of the bridge arm in FIG. 1 includes T1, T2, and T5, and a lower half bridge of the bridge arm includes T3, T4, and T6.

In addition, switching signals of T1 and T2 are high-frequency signals that complement each other, switching signals of T3 and T4 are high-frequency signals that complement each other, and switching signals of T5 and T6 are low-frequency signals that complement each other.

In an embodiment, the output voltage of the bridge arm may be detected by using a voltage detection circuit, to determine whether the output voltage has crossed zero, because the output voltage of the inverter is an alternating voltage.

S302: If the output voltage of the bridge arm has crossed zero, control a corresponding clamping tube to be always on in a predetermined time period after the output voltage crosses zero, or control two clamping tubes to be both always on in a predetermined time period after the output voltage crosses zero.

It can be understood that when a clamping tube is on, a voltage is clamped to a half of a bus voltage, that is, is clamped to Bus_N. Therefore, regardless of whether a high-frequency switching element is on when the output voltage crosses zero, a low-frequency switching element withstands only a half of a bus voltage rather than the whole bus voltage. A half of the bus voltage is within a withstand voltage range of the low-frequency switching element. Therefore, the low-frequency switching element is not damaged.

According to the method provided in this embodiment, when the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This can resolve a problem that one low-frequency switching element withstands the whole bus voltage if a high-frequency switching element is turned on at this time.

Method Embodiment 2

That an output voltage crosses zero includes two cases: The output voltage crosses zero from a positive half cycle and the output voltage crosses zero from a negative half cycle. The following describes these two circumstances separately.

First, that an output voltage crosses zero from a positive half cycle is described. This may be implemented in two manners. One is controlling a corresponding clamping tube to be on, and the other is controlling two clamping tubes to be both on.

Figure 4:
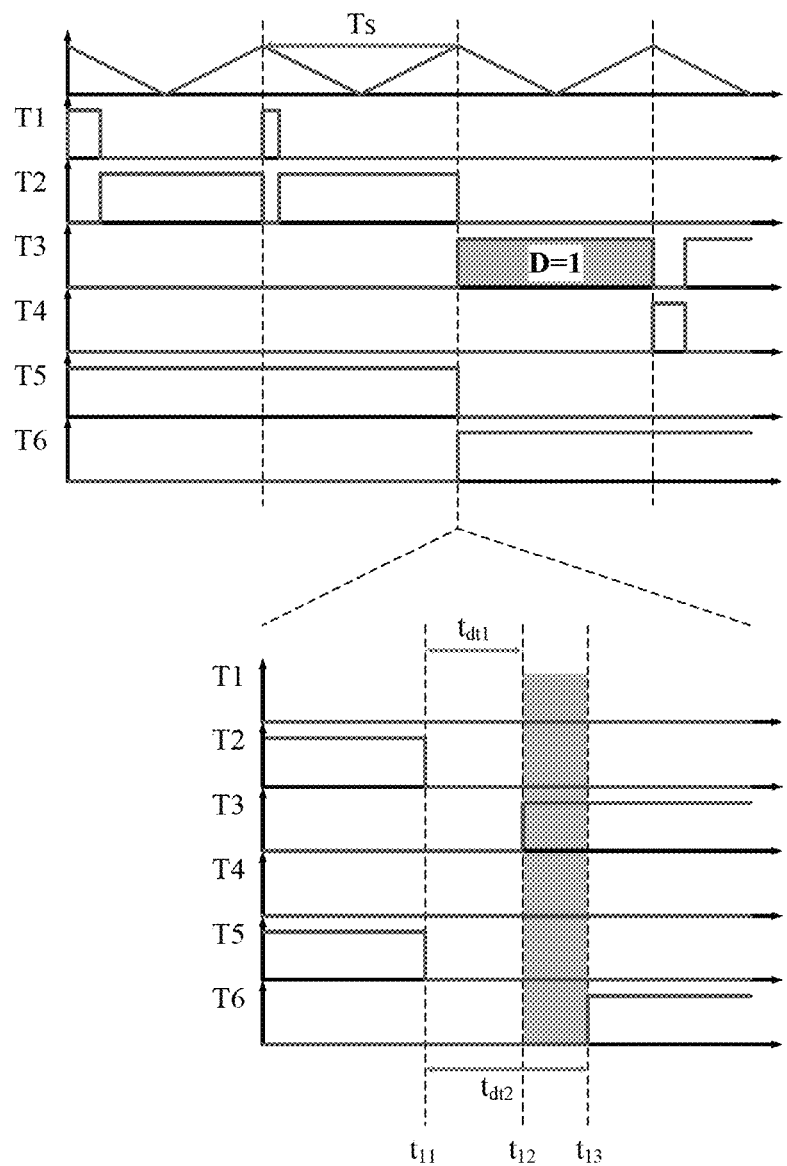
FIG. 4 is a time sequence diagram of controlling one clamping tube to be on, when an output voltage crosses zero from a positive half cycle, according to an embodiment of this application.

FIG. 4 is a time sequence diagram of controlling one clamping tube to be on, when an output voltage crosses zero from a positive half cycle.

When an output voltage crosses zero from a positive half cycle, the controlling a corresponding clamping tube to be always on in a predetermined time period after the output voltage crosses zero is specifically:

controlling a clamping tube T3 in a lower half bridge to be always on in the predetermined time period after the output voltage crosses zero.

As shown in FIG. 4, at a moment t11, a voltage detection circuit detects that an output voltage crosses zero from a positive cycle, and in this case, a high-frequency switching element T2 is turned off and an industrial-frequency switching element T5 is turned off, entering corresponding dead times.

Correspondingly, a first dead time (tdt1) between high-frequency switching elements is shorter than a second dead time (tdt2) between industrial-frequency switching elements, that is, tdt1<tdt2. This reduces output waveform distortion. Output waveform distortion occurs due to existence of a dead time between switching elements, but for normal operation, the dead time between the switching elements is required. Output waveforms include an output voltage waveform and an output current waveform. When the switching elements are in the dead time, there is no change in on/off states of the switching elements, and in this case waveforms of an output voltage and an output current are not controlled, resulting in distortion. To ensure normal operation without causing great distortion, a shorter dead time is preferable. However, if the first dead time between the high-frequency switching elements is longer than the second dead time between the industrial-frequency switching elements, there may be a risk of damaging a low-frequency switching element due to an overvoltage. Therefore, tdt1<tdt2 is set.

A high-frequency switching element corresponding to a negative half cycle needs to be turned on first. At a moment t12, the high-frequency clamping tube T3 is controlled to be on first and its duty ratio is set to 1 (D=1). It can be seen from the figure, a drive signal of T3 is at a high level from a moment t13, that is, T3 is turned on.

After the second dead time corresponding to the low-frequency switching elements expires, an internal tube in the lower half bridge is controlled to be on. In other words, after the dead time tdt2, at the moment t13, an industrial-frequency switching element T6 in a negative half cycle is turned on.

In a high-frequency switching cycle, an output voltage of a bridge arm is clamped to a neutral-point voltage of a direct current bus by a clamping tube, thereby eliminating an overvoltage risk to an industrial-frequency switching tube. A maximum withstand voltage of the industrial-frequency switching tube is designed according to a half of a bus voltage.

The foregoing provides description by using controlling a clamping tube in an upper half bridge to be on, when an output voltage crosses zero from a positive half cycle, as an example. Alternatively, controlling two clamping tubes to be both on may be implemented. This is described in detail in the following with reference to FIG. 5.

Figure 5:
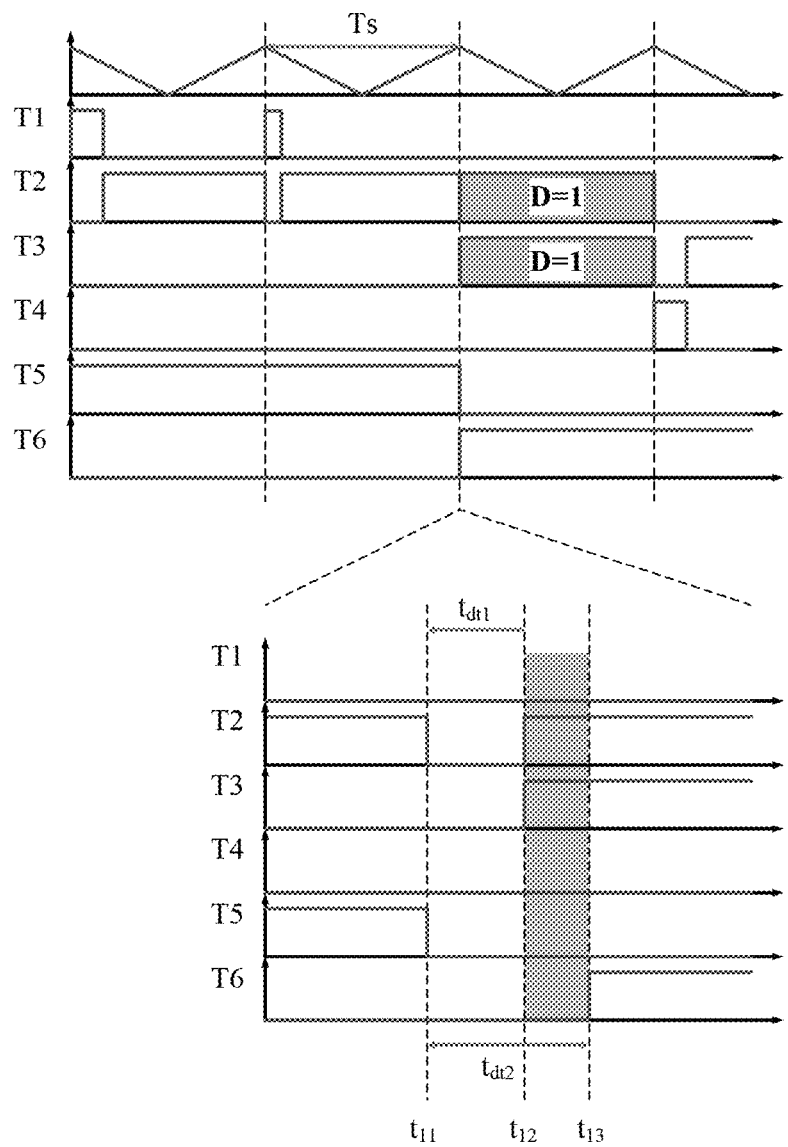
FIG. 5 is a time sequence diagram of controlling two clamping tubes to be on, when an output voltage crosses zero from a positive half cycle, according to an embodiment of this application.

FIG. 5 is a time sequence diagram of controlling two clamping tubes to be both on, when an output voltage crosses zero from a positive half cycle.

FIG. 5 shows a time sequence of on/off states when an output voltage of a bridge arm switches from a positive half cycle to a negative half cycle. A specific modulation method is similar to the method in FIG. 4. The difference is controlling two high-frequency clamping tubes T2 and T3 to be both on in the moment t12. It can be seen from the figure that, T2 and T3 each are corresponding to a high level. In other words, when drive signals are at a high level, the switching elements are turned on, or otherwise, the switching elements are turned off.

The method can well eliminate an overvoltage risk to an industrial-frequency switching tube, and brings a beneficial effect that a plurality of clamping freewheeling circuits can be provided to greatly reduce commutation circuits during voltage switching of a bridge arm. Using a positive current as an example for description, when T2 and T3 are both on, there are the following two current paths: Bus_N-D2-T5-I_out and Bus_N-T3-D6-I_out. Because there are the foregoing two current paths, leakage inductance of the two current paths is in parallel with each other, reducing leakage inductance in a commutation circuit. Smaller leakage inductance in the commutation circuit leads to a lower overvoltage risk to a switching element in a commutation process.

The foregoing describes the case in which an output voltage crosses zero from a positive half cycle. The following describes a case in which an output voltage crosses zero from a negative half cycle.

When the output voltage crosses zero from a negative half cycle, the controlling a corresponding clamping tube to be always on in a predetermined time period after the output voltage crosses zero includes:

controlling a clamping tube in an upper half bridge to be always on in the predetermined time period after the output voltage crosses zero. Still referring to FIG. 1, to be specific, T2 is controlled to be always on in a predetermined time period after the output voltage crosses zero.

Certainly, when an output voltage crosses zero from a negative half cycle, controlling two clamping tubes to be both on may also be implemented, to be specific, T2 and T3 are controlled to be both always on in a predetermined time period after the output voltage crosses zero.

In the foregoing embodiments, the predetermined time period may be set as needed. For example, the predetermined time period after the output voltage crosses zero is the first high-frequency switching cycle after the output voltage crosses zero. Alternatively, the corresponding clamping tube may be controlled to be on during all the first N high-frequency switching cycles after the output voltage crosses zero, where N is a positive integer. For example, if N=2, the clamping tube is controlled to be always on in the first two high-frequency switching cycles after the output voltage crosses zero. However, a value of N cannot be excessively large, because a shorter predetermined time period is preferable. If the predetermined time period is excessively long, output efficiency of the inverter is reduced. Therefore, the preset time period may be shortened as much as possible while a voltage stress problem of a switching element is resolved.

Apparatus Embodiment

Based on the multi-level inverter control method provided in the foregoing embodiments, an embodiment of this application further provides a multi-level inverter control apparatus. The following provides detailed description with reference to an accompanying drawing.

Figure 6:
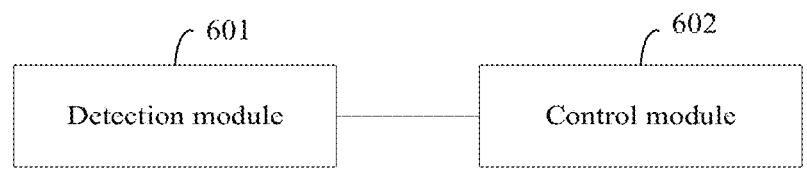
FIG. 6 is a schematic diagram of a multi-level inverter control apparatus according to an embodiment of this application.

FIG. 6 is a schematic diagram of a multi-level inverter control apparatus according to an embodiment of this application.

According to the multi-level inverter control apparatus provided in this embodiment, switching elements of an active clamp multi-level inverter are controlled when an output voltage of the inverter crosses zero, and switching elements in each inverter bridge arm of the active clamp multi-level inverter include an internal tube, an external tube, and a clamping tube. The internal tube and the external tube are connected in series between a positive bus and a negative bus, the clamping tube is connected between a common terminal of the internal tube and the external tube and a bus, the internal tube is a low-frequency switching element, and the external tube and the clamping tube are high-frequency switching elements.

The apparatus includes a detection circuit 601 and a control module 602.

The detection circuit 601 is configured to detect whether an output voltage of a bridge arm of the active clamp multi-level inverter has crossed zero.

The control module 602 is configured to: when the detection circuit 601 detects that the output voltage has crossed zero, control a corresponding clamping tube to be always on in a predetermined time period after the output voltage crosses zero, or control two clamping tubes to be both always on in a predetermined time period after the output voltage crosses zero.

The detection circuit 601 may be implemented by using a voltage detection circuit.

The control module 602 may be implemented by using a controller of the inverter, where the controller may output a pulse drive signal to control an on/off state of a switching tube in the inverter.

When the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This avoids a problem that one low-frequency switching element withstands the whole bus voltage if a high-frequency switching element is turned on at this time.

When the output voltage crosses zero from a positive half cycle, that the control module controls a corresponding clamping tube to be always on in a predetermined time period after the output voltage crosses zero includes:

controlling a clamping tube in a lower half bridge to be always on in the predetermined time period after the output voltage crosses zero.

When the output voltage crosses zero from a negative half cycle, that the control module controls a corresponding clamping tube to be always on in a predetermined time period after the output voltage crosses zero includes:

controlling a clamping tube in an upper half bridge to be always on in the predetermined time period after the output voltage crosses zero.

The predetermined time period may be set as needed. For example, the predetermined time period after the output voltage crosses zero is the first high-frequency switching cycle after the output voltage crosses zero. Alternatively, the corresponding clamping tube may be controlled to be on during all the first N high-frequency switching cycles after the output voltage crosses zero, where N is a positive integer. For example, if N=2, the clamping tube is controlled to be always on in the first two high-frequency switching cycles after the output voltage crosses zero. However, a value of N cannot be excessively large, because a shorter predetermined time period is preferable. If the predetermined time period is excessively long, output efficiency of the inverter is reduced. Therefore, the preset time period may be shortened as much as possible while a voltage stress problem of a switching element is resolved.

Inverter Embodiment

Based on the multi-level inverter control method and apparatus provided in the foregoing embodiments, an embodiment of this application further provides a multi-level inverter, and the following provides detailed description with reference to an accompanying drawing.

Figure 7:
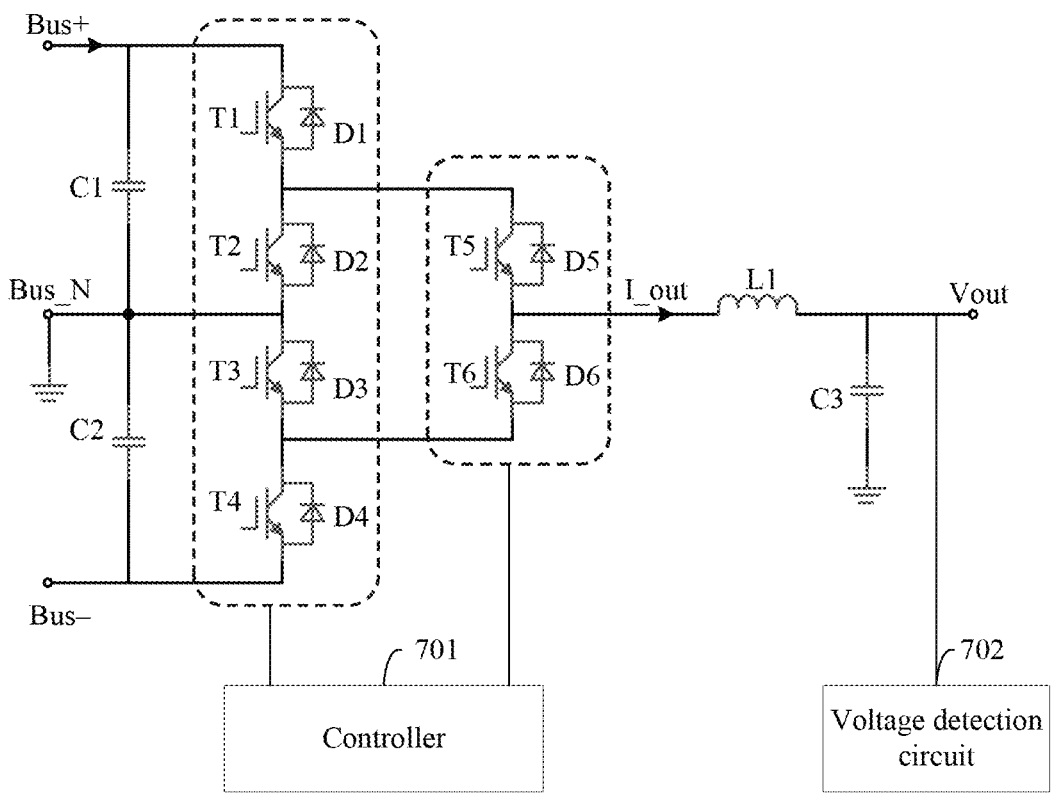
FIG. 7 is a schematic diagram of a multi-level inverter according to an embodiment of this application.

FIG. 7 is a schematic diagram of a multi-level inverter according to an embodiment of this application.

According to the multi-level inverter provided in this embodiment, the multi-level inverter is an active clamp multi-level inverter, and switching elements in each inverter bridge arm of the active clamp multi-level inverter include an internal tube, an external tube, and a clamping tube, where the internal tube and the external tube are connected in series between a positive bus and a negative bus, the clamping tube is connected between a common terminal of the internal tube and the external tube and a bus, the internal tube is a low-frequency switching element, and the external tube and the clamping tube are high-frequency switching elements. The multi-level inverter includes a voltage detection circuit 702 and a controller 701.

T2 and T3 are used for clamping, and therefore T2 and T3 are referred to as clamping tubes. T1, T5, T6, and T4 form a bridge arm. T1 and T4 are on an outer side, and T5 and T6 are on an inner side, and therefore T1 and T4 are referred to as external tubes, and T5 and T6 are referred to as internal tubes.

The voltage detection circuit 702 is configured to detect whether an output voltage of a bridge arm of the active clamp multi-level inverter has crossed zero.

The controller 701 is configured to: when the voltage detection circuit detects that the output voltage has crossed zero, control a corresponding clamping tube to be always on in a predetermined time period after the output voltage crosses zero, or control two clamping tubes to be both always on in a predetermined time period after the output voltage crosses zero.

When the output voltage crosses zero, a corresponding low-frequency switching element is in a dead time. Therefore, if a corresponding clamping tube is turned on at this time, a voltage withstood by the low-frequency switching element is forcibly clamped to a half of a bus voltage by the turned-on clamping tube. The clamping tube is connected to a neutral point (a midpoint of the bus voltage), and therefore a voltage of the neutral point is a half of the whole bus voltage. This can resolve a problem that one low-frequency switching element withstands the whole bus voltage if a high-frequency switching element is turned on at this time.

When the output voltage crosses zero from a positive half cycle, that the controller controls a corresponding clamping tube to be always on in a predetermined time period after the output voltage crosses zero includes:

controlling a clamping tube in a lower half bridge to be always on in the predetermined time period after the output voltage crosses zero. To be specific, T3 is turned on.

Certainly, when the output voltage crosses zero from a positive half cycle, controlling two clamping tubes to be both on may also be implemented. To be specific, T2 and T3 are controlled to be both always on in a predetermined time period after the output voltage crosses zero from a positive half cycle.

When the output voltage crosses zero from a negative half cycle, that the controller controls a corresponding clamping tube to be always on in a predetermined time period after the output voltage crosses zero includes:

controlling a clamping tube in an upper half bridge to be always on in the predetermined time period after the output voltage crosses zero. To be specific, T2 is turned on.

Certainly, when an output voltage crosses zero from a negative half cycle, controlling two clamping tubes to be both on may also be implemented, to be specific, T2 and T3 are controlled to be both always on in a predetermined time period after the output voltage crosses zero.

In addition, correspondingly, a first dead time (tdt1) between high-frequency switching elements is shorter than a second dead time (tdt2) between industrial-frequency switching elements, that is, tdt1<tdt2. This reduces output waveform distortion.

When an output voltage crosses zero, if two clamping tubes are controlled to be both on, a plurality of clamping freewheeling circuits may be provided, reducing leakage inductance in a commutation circuit. Smaller leakage inductance in the commutation circuit leads to a lower overvoltage risk to a switching element in a commutation process.

It should be understood that, in this application, "at least one" indicates one or more, and "a plurality of" indicates two or more. "And/or" is used to describe an association relationship for describing associated objects and represents that three relationships may exist. For example, A and/or B may represent the following three cases: Only A exists, both A and B exist, and only B exists. The character "/" generally indicates an "or" relationship between the associated objects. "At least one of the following" or similar expressions indicate any combination of the following, including one or any combination of two or more of the following. For example, at least one of a, b, or c may indicate: a, b, c, "a and b", "a and c", "b and c", or "a, b and c", where there may one or more a-s, one or more b-s, and one or more c-s.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A method for controlling a multi-level inverter, comprising:

when an output voltage of a bridge arm of the multi-level inverter has crossed zero, wherein switching elements in each bridge arm of the multi-level inverter comprise an internal tube, an external tube, and a clamping tube, wherein the internal tube and the external tube are connected in series between a positive bus and a negative bus, wherein the clamping tube is connected between a common terminal of the internal tube and the external tube and a bus, and wherein the internal tube is a low-frequency switching element and the external tube and the clamping tube are high-frequency switching elements, and controlling a corresponding clamping tube to be on within a predetermined time period after the output voltage crosses zero, or controlling two clamping tubes to be both on within the predetermined time period after the output voltage crosses zero, wherein a first dead time corresponding to the high-frequency switching elements is shorter than a second dead time corresponding to the low-frequency switching elements.

2. The method according to claim 1, wherein when the output voltage crosses zero from a positive half cycle, controlling a corresponding clamping tube to be on within a predetermined time period after the output voltage crosses zero comprises:

controlling a clamping tube in a lower half bridge to be on within the predetermined time period after the output voltage crosses zero.

3. The method according to claim 1, wherein when the output voltage crosses zero from a negative half cycle, controlling a corresponding clamping tube to be on within a predetermined time period after the output voltage crosses zero comprises:

controlling a clamping tube in an upper half bridge to be on within the predetermined time period after the output voltage crosses zero.

4. The method according to claim 1, wherein the predetermined time period after the output voltage crosses zero is:

a first high-frequency switching cycle after the output voltage crosses zero.

5. The method according to claim 2, further comprising: after a second dead time corresponding to the low-frequency switching elements expires, controlling an internal tube in the lower half bridge to be on.

6. The method according to claim 3, further comprising: after a second dead time corresponding to the low-frequency switching elements expires, controlling an internal tube in the upper half bridge to be on.

7. An apparatus for controlling a multi-level inverter, comprising:

a detection circuit to detect an output voltage of a bridge arm of a multi-level inverter, wherein switching elements in each bridge arm of the multi-level inverter comprise an internal tube, an external tube, and a clamping tube, wherein the internal tube and the external tube are connected in series between a positive bus and a negative bus, wherein the clamping tube is connected between a common terminal of the internal tube and the external tube and a bus, and wherein the internal tube is a low-frequency switching element and the external tube and the clamping tube are high-frequency switching elements; and a control device configured to:

when the detection circuit detects that the output voltage has crossed zero, control a corresponding clamping tube to be on within a predetermined time period after the output voltage crosses zero, or control two clamping tubes to be both on within the predetermined time period after the output voltage crosses zero, wherein a first dead time corresponding to the high-frequency switching elements is shorter than a second dead time corresponding to the low-frequency switching elements.

8. The apparatus according to claim 7, wherein when the output voltage crosses zero from a positive half cycle, controlling a corresponding clamping tube to be on within a predetermined time period after the output voltage crosses zero comprises:
controlling a clamping tube in a lower half bridge to be on within the predetermined time period after the output voltage crosses zero.

9. The apparatus according to claim 7, wherein when the output voltage crosses zero from a negative half cycle, controlling a corresponding clamping tube to be on within a predetermined time period after the output voltage crosses zero comprises:
controlling a clamping tube in an upper half bridge to be on within the predetermined time period after the output voltage crosses zero.

10. The apparatus according to claim 7, wherein the predetermined time period after the output voltage crosses zero is:
a first high-frequency switching cycle after the output voltage crosses zero.

11. The apparatus according to claim 8, wherein after a second dead time corresponding to the low-frequency switching elements expires, the control device is to control an internal tube in the lower half bridge to be on.

12. The apparatus according to claim 9, wherein after a second dead time corresponding to the low-frequency switching elements expires, the control device is to control an internal tube in the upper half bridge to be on.

13. A multi-level inverter, comprising:
a voltage detection circuit to detect an output voltage of a bridge arm of the multi-level inverter, wherein switching elements in each bridge arm of the multi-level inverter comprise an internal tube, an external tube, and a clamping tube, wherein the internal tube and the external tube are connected in series between a positive bus and a negative bus, wherein the clamping tube is connected between a common terminal of the internal tube and the external tube and a bus, and wherein the internal tube is a low-frequency switching element and the external tube and the clamping tube are high-frequency switching elements; and
a controller to:
when the voltage detection circuit detects that the output voltage has crossed zero, control a corresponding clamping tube to be on within a predetermined time period after the output voltage crosses zero, or
control two clamping tubes to be both on within the predetermined time period after the output voltage crosses zero, wherein a first dead time corresponding to the high-frequency switching elements is shorter than a second dead time corresponding to the low-frequency switching elements.

14. The multi-level inverter according to claim 13, wherein when the output voltage crosses zero from a positive half cycle, controlling a corresponding clamping tube to be on within a predetermined time period after the output voltage crosses zero comprises:
controlling a clamping tube in a lower half bridge to be on within the predetermined time period after the output voltage crosses zero.

15. The multi-level inverter according to claim 13, wherein when the output voltage crosses zero from a negative half cycle, controlling a corresponding clamping tube to be on within the predetermined time period after the output voltage crosses zero comprises:
controlling a clamping tube in an upper half bridge to be on within the predetermined time period after the output voltage crosses zero.

16. The multi-level inverter according to claim 13, wherein the predetermined time period after the output voltage crosses zero is:
a first high-frequency switching cycle after the output voltage crosses zero.

17. The multi-level inverter according to claim 14, wherein after a second dead time corresponding to the low-frequency switching elements expires, the controller is to control an internal tube in the lower half bridge to be on.

18. The multi-level inverter according to claim 15, wherein after a second dead time corresponding to the low-frequency switching elements expires, the control device is to control an internal tube in the upper half bridge to be on.

* * * * *